United States Patent

[11] 3,567,999

[72] Inventors Richard L. Larson;
George C. Wright, Barrington; Robert J. Drenning, Chicago, Ill.
[21] Appl. No. 763,805
[22] Filed Sept. 30, 1968
[45] Patented Mar. 2, 1971
[73] Assignee Methode Electronics, Inc.
Chicago, Ill.

[54] INTEGRATED CIRCUIT PANEL
7 Claims, 6 Drawing Figs.

[52] U.S. Cl. .......... 317/101, 174/68.5, 174/117, 174/72
[51] Int. Cl. .......... H05k 1/04
[50] Field of Search .......... 317/101 (CC), 101 (CM), 101 (DH); 174/68.5 (Cursory), 72 (B), 117.11; 339/(Inquired)

[56] References Cited
UNITED STATES PATENTS
1,999,137 4/1935 Flewelling .......... 317/101CM(UX)
3,240,999 3/1966 Sands .......... 174/68.5X
3,320,488 5/1967 Karew et al. .......... 317/101DH(UX)
3,418,535 12/1968 Martinell .......... 317/101CM(UX)
3,474,297 10/1969 Bylander .......... 317/101CC(UX)
3,476,871 11/1969 Erdle .......... 174/172B(UX)

OTHER REFERENCES
Augat, " High Density Dual-in-line Packaging Panel", Electronic Design, Aug. 2, 1967, also published as Augat Catalog No. 266 p.p. 1, 3, 4 and 6 copy 174-FP.
" Laminated and Molded Bus Bars For Power Distribution" Eldre Components Co. Jan. 30, 1967 pp. 1, 7, 12, 13 and 15 copy 174, 117.11

*Primary Examiner*—David Smith, Jr.
*Attorney*—Brown, Jackson, Boettcher and Dienner

ABSTRACT: A microelectronic panel comprising a printed circuit board with etched circuits and a multilayer, multiterminal laminar bus bar system mechanically attached to the board and electrically connected with the etched circuits, with said etched circuits connecting electrically with sockets, said bussing system being nondestructively removable from said board and having controlled impedance characteristics.

Inventors.
Richard L. Larson,
George C. Wright, &
Robert J. Drenning
By. Brown, Jackson, Boettcher & Dienner
Att'ys Inventors.
Richard L. Larson,
George C. Wright, &
Robert J. Drenning.
By. Brown, Jackson, Boettcher & Dienner
Attys.

Inventors.
Richard L. Larson,
George C. Wright, &
Robert J. Drenning
By. Brown, Jackson, Boettcher & Dienner
Attys.

INTEGRATED CIRCUIT PANEL

SUMMARY OF THE INVENTION

With the need for increasingly complex, high-speed, high-density circuits, various new packaging concepts have evolved. One of these is the multilayer printed circuit board which allows for greater packaging densities per unit of area and shorter lead lengths between connections which is particularly desirable in high-frequency applications. It has, however, certain inherent characteristics which severely limit its range of use.

Breadboards have been used to refine the development and verify the achievement and practicality of a theoretical design. Though a multilayer board may be planned for ultimate use in production, it is generally unfeasible for use at the breadboard stage of development. To overcome the limitations and disadvantages of prior structures, we have conceived of a new discrete multilayer distribution system which is attached to a one-or two-sided printed circuit board.

Briefly we have made possible the application of mechanically produced discrete circuits to a printed-circuit board.

To this end we provide a multilayer bussing system in which discrete circuitry is electrically insulated from the printed circuit (whether it be a one- or two-side printed-circuit board) and is also electrically insulated from other discrete circuitry and components. This bussing system comprises a flat laminar bus bar structure which, for example, may have two conductive layers and three dielectric layers separating and enveloping the conductive layers, with a plurality of terminals.

Thus we are able to duplicate some of the desirable features of multilayer boards and simultaneously eliminate some of the undesirable features.

In the preferred form the bussing system is mechanically and electrically connected to the printed-circuit board and can supply multiple voltage levels to a plurality of sockets such as dual-in-line sockets for 14 and 16 terminal dual-in-line microelectronic circuits. A major advantage is the ability to produce high capacitance between conductive layers, a necessity for the supression of noise, and eliminating the need for discrete external capacitors.

Another advantage resides in the replaceability of the sockets, terminals and particularly the bussing system, if damaged, without destruction of the entire package, whereas, heretofore, a defect in a multilayer printed-circuit board may have resulted in the entire package being discarded.

Another advantage resides in the ability of our improved structure to provide both the X and Y planes through a single bussing unit. Other objects, advantages and uses will appear or be readily appreciated by one skilled in the art from the following description and from the drawings.

Figures 1, 4, 5, 6:
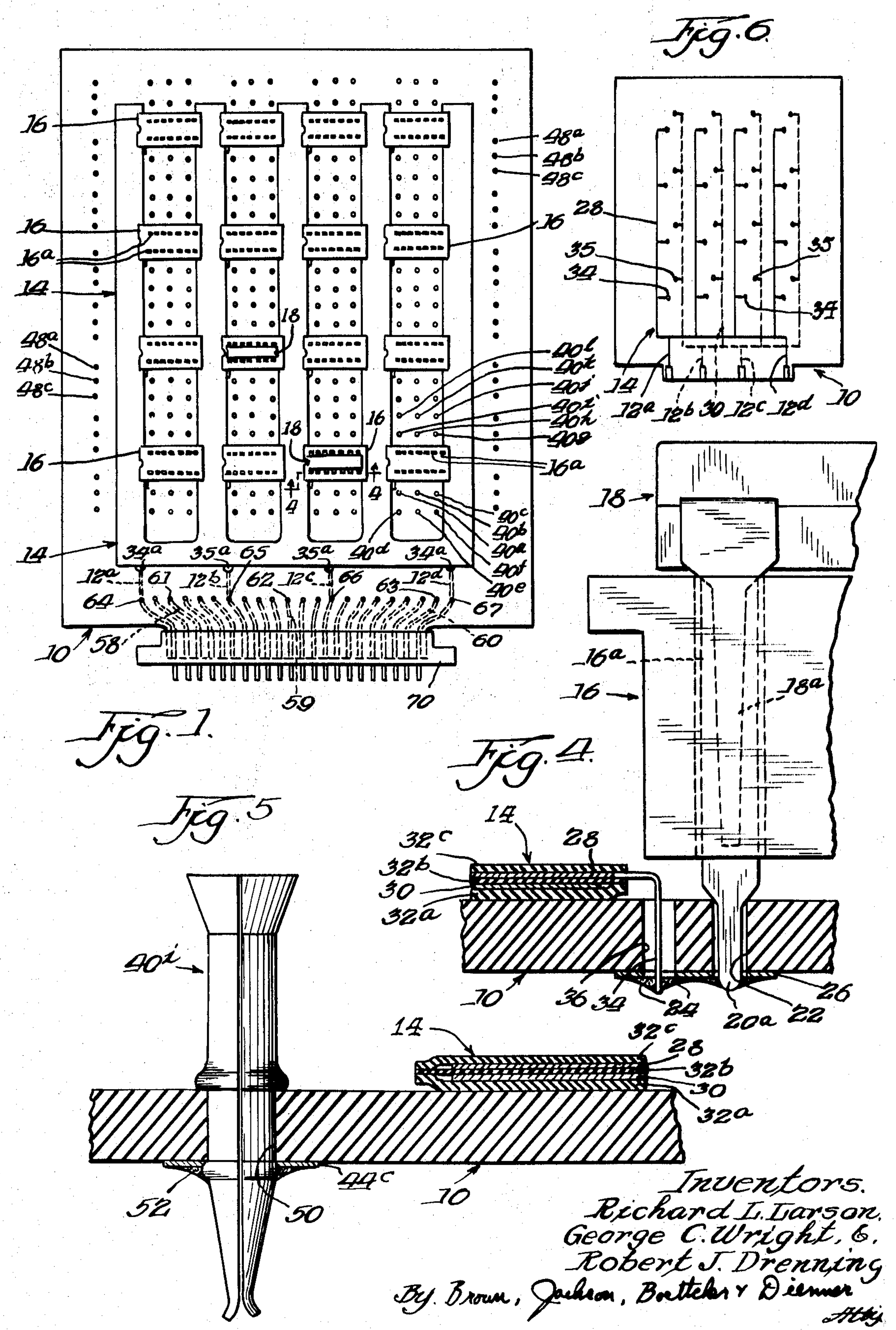
FIG. 1 is a top plane view of an integrated circuit panel incorporating our invention.
FIG. 4 is an enlarged, fragmentary view, partially in section (on still larger scale), substantially on the line 4–4 of FIG. 1, looking in the direction of the arrows.
FIG. 5 is an enlarged, fragmentary view, partially in section, substantially on the line 5–5 of FIG. 2, looking in the direction of the arrows.
FIG. 6 is a diagrammatic representation, on smaller scale, of the panel and the circuit for the bussing system forming a part of the integrated circuit panel.

Referring now to the drawings, a printed-circuit board, or panel, formed of electrically insulating material such as glass epoxy, for example, is indicated generally by the reference numeral 10. It carries a large number of etched circuits, including 12*a*, 12*b*, 12*c* and 12*d*, for example. Mechanically connected to the printed circuit board 10 is a multilayer, multiterminal insulated bussing system, indicated generally by the reference numeral 14. Also mechanically connected with the printed-circuit board are a plurality of sockets 16 which are illustrated as dual-in-line sockets adapted to receive 14 terminal dual-in-line microelectronic circuits which are designated generally by the reference numeral 18.

Each dual-in-line socket 16 has 14 female receptacles (such as 16*a* of FIGS. 1 and 4) and each receptacle has a terminal, such as 20*a*, which extends through an opening 22 (see example in FIG. 4) in the printed-circuit board 10. Each of the dual-in-line microelectronic circuits 18 has male terminals, such as terminal 18*a* (FIG. 4), which are adapted to be received by a female receptacle, such as receptacle 16*a* (FIG. 4). Two of the terminals of the female receptacles—20*a* and another at the diagonally opposite corner of each dual-in-line socket 16—are electrically connected by means of solder 24 and etched pads 26 with terminals of the bussing system, terminal 34 of the bussing system being integrally formed with one insulated conductive path 28 and the other terminal (not shown, but diagonally opposite from terminal 34 on socket 16) being connected with a terminal, such as 35 FIG. 6, of the other conductive path 30 of the bussing system.

The paths 28 and 30 are flat and laminated between and enveloped by three dielectric laminations 32*a*, 32*b* and 32*c* which insulate them from all etched circuits, terminals etc. It will be appreciated that multiple voltage levels can be provided to a plurality of sockets, as well as terminals, and that it is not necessary to limit these discrete conductive circuits to two in number. The bussing system 14 is illustrated in the shape of a grid which thereby advantageously provides power in both the X and Y planes by a single structure. However other configurations may be employed without departing from our invention.

The bussing system is mechanically connected to the board or panel 10 by its terminals, such as terminal 34, extending through a hole 36 (FIG. 4) in the printed-circuit board 10 and being soldered as at 24. By this soldered connection and etched pad 26 terminal 34 is electrically connected with terminal 20*a* of socket 16. One of the advantages of our invention resides in the replaceability of the bussing system, if damaged, without the necessity of destroying the entire package. This may be done by unsoldering the terminal connections, such as 34, of the bussing system.

The bussing system is constructed of selected conductive material for the conductive paths 28 and 30 and separated by an insulator 32*b* so dimensioned as to produce a high capacitance between conductive layers, thereby suppressing noise. This eliminates the need for discrete external capacitors.

On either side of each dual-in-line socket 16 are six female connectors, such as 40*a* through 40*f* on one side and 40*g* through 40*l* on the other side.

Figure 2:
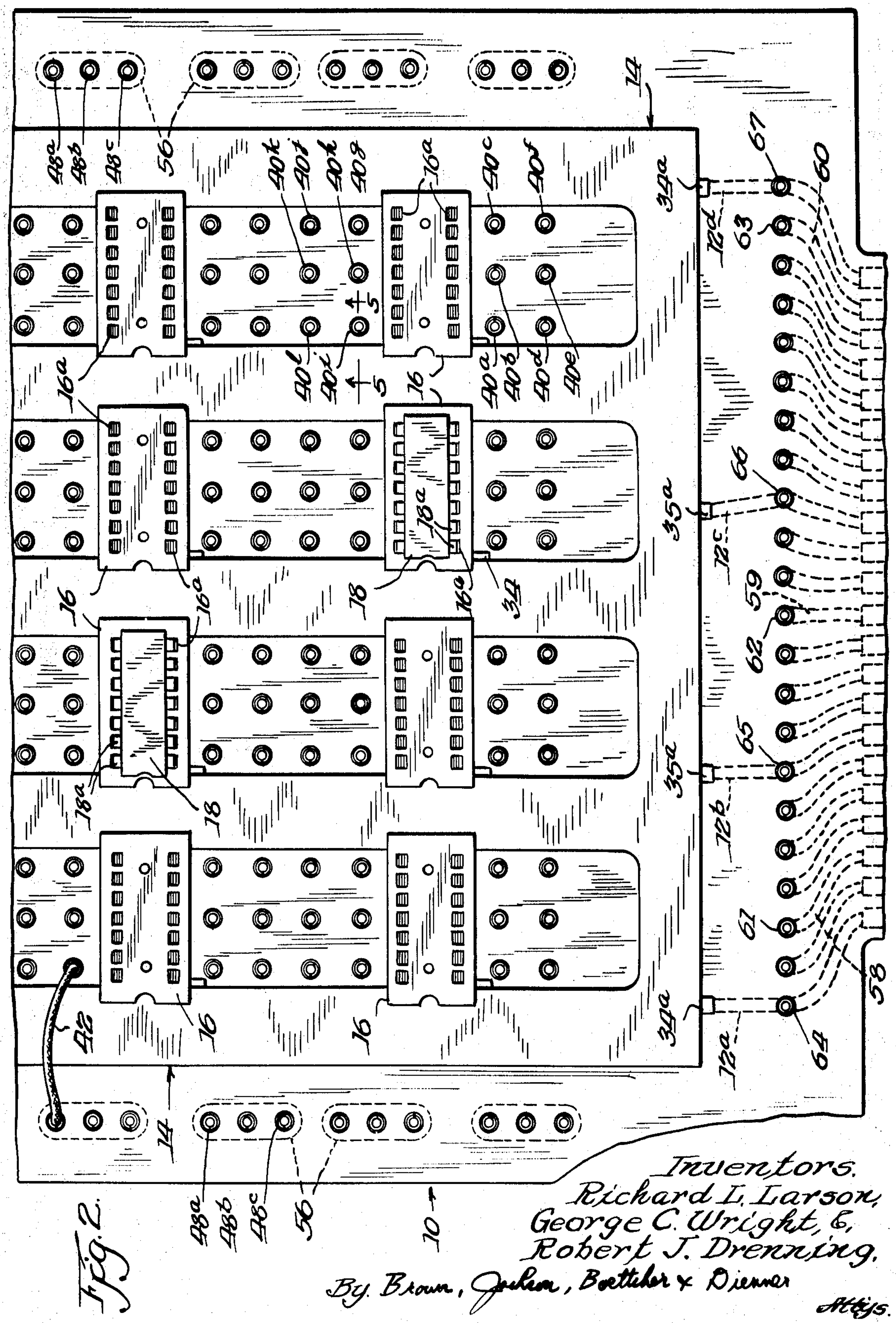
FIG. 2 is a fragmentary, enlarged view of the board, or panel, of FIG. 1.

Each female connector, such as 40*i*, for example, is of a known type and is shown on larger scale in FIG. 5. The upper end is adapted to receive a male terminal which, for example, could be a terminal end of a patch cord, such as is shown at 42 in FIG. 2. The female connector passes through a hole, such as hole 50 in the printed circuit board 10 and its lower end is soldered as at 52 to an adjacent etched circuit 44*c*.

Figure 3:
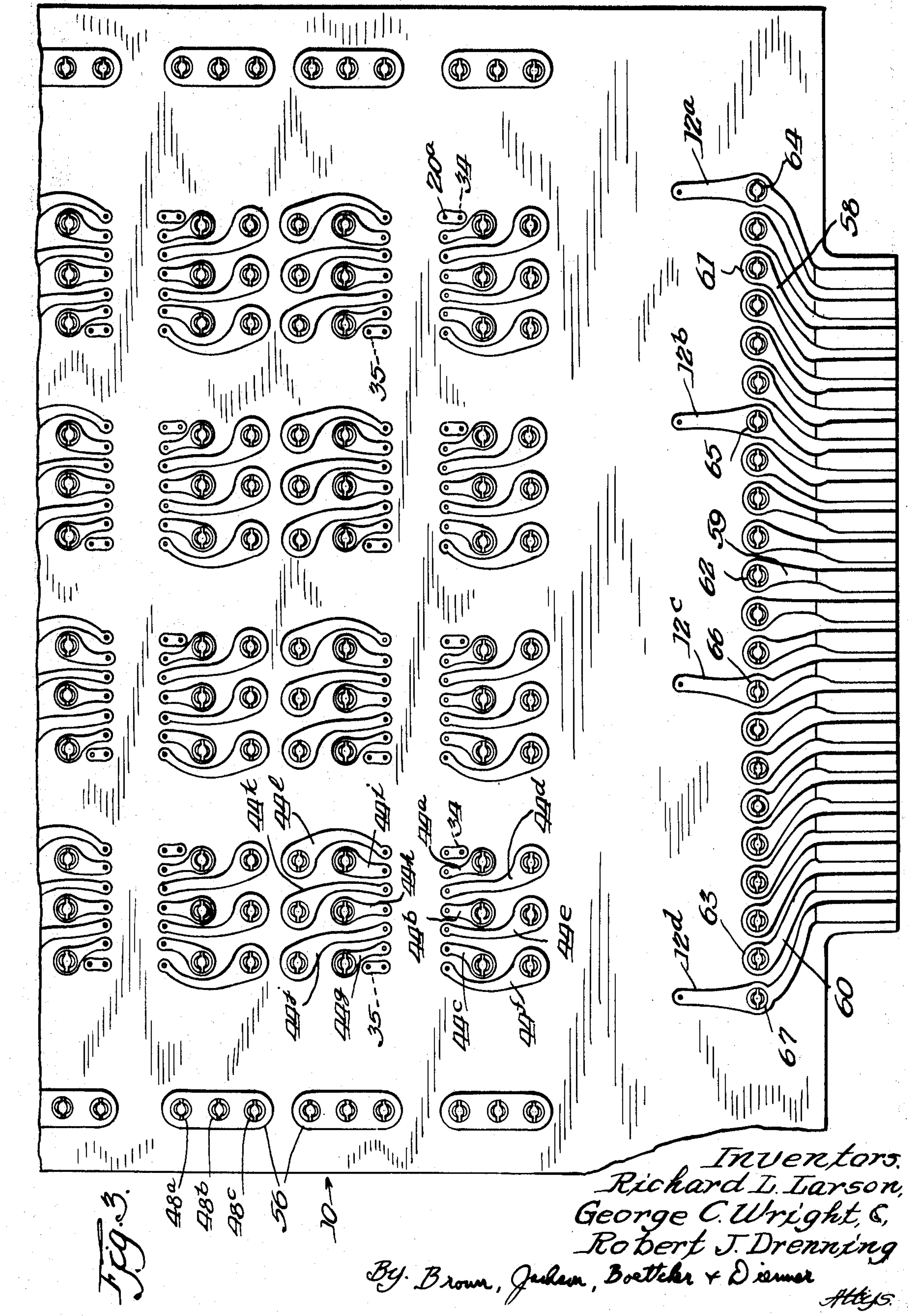
FIG. 3 is a plan view of the opposite side of the fragmentary enlarged view of FIG. 2.

Each corresponding terminal of the female sockets 40*a*, 40*b*, etc., in a dual-in-line socket 16 passes through a hole in the printed circuit board 10 and is soldered to an etched circuit, such as circuits 44*a* through 44*l* (FIG. 3), whereby each female socket is electrically connected with a female connector. When selected microelectronic circuits such as 18 have their terminals disposed in the female sockets of a dual-in-line socket 16, then the circuits of the microelectronic circuit component 18 are electrically connected with the female connectors such as 40*a* through 40*l*. By use of patch cords between female connectors, various circuit patterns can be established.

Another female connectors, such as the group of three 48*a*, 48*b* and 48*c*,—referred to below as "female terminals" to more easily distinguish them from the female connectors associated with the dual-in-line sockets 16—are interconnected by an etched circuit, or pad, 56. These may conveniently be used to provide a junction point for two or three patch cords in setting up a circuit pattern. Groups of such female connectors may be disposed around two or three sides of the grid pattern of the bussing system. It will be understood that groups of two or more such connectors can constitute such a junction.

On the fourth margin of the printed-circuit board 10 it will be seen that in addition to etched circuits 12*a*, 12*b*, 12*c* and 12*d*, which lead to pairs of terminals such as 34*a* and 35*a* of the bussing system 14, there are additional etched circuits, such as 58, 59, 60, each leading from the margin of the board to a separate female terminal such as 61, 62, 63, respectively. In addition each etched circuit 12*a*, 12*b*, 12*c* and 12*d* includes a female terminal 64, 65, 66 and 67, respectively. All of these last mentioned etched circuits lead to the margin of the printed-circuit board in spaced relation where they are adapted to be electrically connected with a unitary, removable connector component, indicated generally by the reference numeral 70, which provides each etched circuit with a male terminal.

It will be observed from the foregoing that we have made possible the application of mechanically produced discrete circuits to a printed-circuit board, to permit extensive making and testing of circuit patterns. Furthermore, the construction is such that the resulting microelectronic packaging panel can have any of its discrete circuitry or components removable without destroying the panel. In addition we have eliminated the necessity for external capacitors which heretofore have been required for noise suppression.

We claim:

1. A microelectronic packaging panel for mounting and connecting a plurality of circuit components in a predetermined circuit arrangement comprising an insulating board having a first and second side separated by a substantial thickness of insulating material, a multilayer multiterminal bus bar mounted on said first side of said insulating board and having at least a pair of elongated continuous conductive strips electrically insulated from each other, a plurality of integrated circuit sockets having a set of female receptacles extending from said first side through apertures formed in said insulating board, a set of individual female connectors adjacent each of said integrated circuit sockets extending from said first side through openings formed in said insulating board, a plurality of etched electrical strips on said second side interconnecting said female receptacles and said female connectors, and terminal means for connecting two of said female receptacles of each of said integrated circuit sockets to said pair of conductive strips.

2. A microelectronic packaging panel as defined in claim 1, wherein said terminal means for connecting two of said female receptacles of said integrated circuit sockets to said pair of conductive strips comprises a pair of electrical conductors extending from said pair of conductive strips through said insulating board, and a pair of etched pads on said second side of said board electrically interconnecting said two of said female receptacles to said conductor wires and soldered thereto.

3. A microelectronic packaging panel as defined in claim 1, wherein said multilayer, multiterminal bus bar includes a plurality of spaced parallel branches and wherein said integrated circuit sockets are disposed between said branches.

4. A microelectronic packaging panel for mounting and connecting a plurality of circuit components in a predetermined arrangement comprising an insulating board having first and second sides separated by a substantial thickness of insulating material, a multilayer multiterminal bus bar mounted on said first side of said insulating board and having at least a pair of elongated continuous conductive strips electrically insulated from each other, a plurality of dual-in-line sockets having a set of female receptacles extending from said one side through apertures formed in said insulating board, a set of individual female connectors adjacent each of said dual-in-line sockets extending from said first side through openings formed in said insulating board, a plurality of etched electrical strips on said second side interconnecting said female receptacles and said female connectors, terminal means for connecting two of said female receptacles of each of said dual-in-line sockets to said pair of conductive strips, and a plurality of female terminals adaptable for interconnecting with a mechanically and electrically printed circuit connector interconnected at the edge of said insulating board to a set of etched printed circuits on said first side.

5. A microelectronic packaging panel as defined in claim 4, wherein two of said etched printed circuits interconnect said pair of conductive strips to two of said female terminals.

6. A microelectronic packaging panel as defined in claim 4, wherein said terminal means for connecting two of said female receptacles of said dual-in-line sockets to said pair of conductive strips comprises a pair of electrical conductors extending from said pair of conductive strips through said insulating board, and a pair of etched pads on said second side of said board electrically interconnecting said two of said female receptacles to said conductor wires and soldered thereto.

7. A microelectronic packaging panel as defined in claim 4, wherein said multilayer, multiterminal bus bar includes a plurality of spaced parallel branches and wherein said dual-in-line sockets are disposed between said branches.